(12) United States Patent
Charneski et al.

(10) Patent No.: US 6,355,562 B1
(45) Date of Patent: Mar. 12, 2002

(54) ADHESION PROMOTION METHOD FOR CVD COPPER METALLIZATION IN IC APPLICATIONS

(75) Inventors: Lawrence J. Charneski; Tue Nguyen, both of Vancouver, WA (US); Gautam Bhandari, Danbury, CT (US)

(73) Assignee: Advanced Technology Materials, Inc., Danbury, CT (US)

( * ) Notice: Subject to any disclaimer, the term of this patent is extended or adjusted under 35 U.S.C. 154(b) by 0 days.

(21) Appl. No.: 09/108,260

(22) Filed: Jul. 1, 1998

(51) Int. Cl.$^7$ ................................................ H01L 21/44
(52) U.S. Cl. .................. 438/681; 438/654; 438/652; 438/622
(58) Field of Search ................................ 438/628, 629, 438/644, 653, 654, 660, 663, 680, 687, 681; 257/754, 762, 764, 766, 768, 770, 753, 741, 748, 769; 427/585, 99, 255.7

(56) References Cited

U.S. PATENT DOCUMENTS

| | | | |
|---|---|---|---|
| 4,842,891 A | | 6/1989 | Miyazaki et al. ............. 427/35 |
| 5,220,044 A | * | 6/1993 | Baum et al. ................... 556/40 |
| 5,744,192 A | | 4/1998 | Nguyen et al. ............... 427/99 |
| 5,909,637 A | * | 6/1999 | Charneski et al. .......... 438/687 |
| 5,913,144 A | * | 6/1999 | Nguyen et al. .............. 438/643 |
| 5,918,150 A | * | 6/1999 | Nguyen et al. .............. 438/687 |
| 5,969,422 A | * | 10/1999 | Ting et al. ................... 257/762 |
| 5,985,758 A | * | 11/1999 | Kim .............................. 438/653 |
| 5,989,623 A | * | 11/1999 | Chen et al. ................... 427/97 |
| 6,010,960 A | * | 1/2000 | Nogami ....................... 438/653 |
| 6,015,749 A | * | 1/2000 | Liu et al. ..................... 438/628 |
| 6,037,257 A | * | 3/2000 | Chiang et al. ............... 438/687 |
| 6,039,808 A | * | 3/2000 | Toyoda et al. .............. 118/715 |
| 6,171,661 B1 | * | 1/2001 | Zheng et al. ................ 427/535 |

OTHER PUBLICATIONS

Article entitled, Chemical Vapor Deposition of Copper for IC Metallization: Precursor Chemistry and Molecular Structure by P. Doppelt and T. H. Baum, published in MRS Bulletin/Aug. 1994, pp. 41–48.

(List continued on next page.)

Primary Examiner—Carl Whitehead, Jr.
Assistant Examiner—Christy Novacek
(74) Attorney, Agent, or Firm—Robert A. McLauchlan; Margaret Chappuis; Marianne Fuierer

(57) ABSTRACT

A method is provided for promoting adhesion of CVD copper to diffusion barrier material in integrated circuit manufacturing. The method uses a two-step CVD copper metallization process. Following deposition of a diffusion barrier layer on the IC substrate, a first layer of CVD copper is deposited on the barrier material. The first layer is preferably thin (less than 300 Å) and deposited using a precursor which yields an adherent conforming layer of copper. The suggested precursor for use in depositing the first layer of CVD copper is (hfac)Cu(1,5-Dimethylcyclooctadiene). The first layer of CVD copper serves as a "seed" layer to which a subsequently-deposited "fill" or "bulk" layer of CVD copper will readily adhere. The second copper deposition step of the two-step process is the deposit of a second layer of copper by means of CVD using another precursor, different from (hfac)Cu(1,5-Dimethylcyclooctadiene). The precursor selected for depositing the second layer of CVD copper is preferably one which has a substantially higher deposition rate, or is otherwise less costly or simpler to use, which will lower production costs since most of the mass of deposited copper is in the second layer. Because the second CVD copper layer is deposited on copper, adhesion to the first-deposited layer will be good because the layers are joined by copper-to-copper bonds. Thus, the two layer process provides optimal economy with good adhesion to barrier material.

16 Claims, 6 Drawing Sheets

OTHER PUBLICATIONS

Article entitled, "Chemical Vapor Deposited Copper from Alkyne Stabilized Copper (I) Hexafluoroacetylacetonate Complexes" by T. H. Baum and C. E. Larson, published in J. Electrochem, Soc. vol. 140, No. Jan. 1, 1993, pp. 154–159.

Article entitled, Kinetics of chemical Vapor Deposition of Copper from (6–diketonate)CuL Precursors by A. Jain, K.M. Chi, T.T. Kodas and M. J. Hampden–Smith, published in Mat. Res. Soc. Symp. Proc. vol. 260, 1992 Materials Research Society, pp. 113–118.

* cited by examiner

ADHESION PROMOTION METHOD FOR CVD COPPER METALLIZATION IN IC APPLICATIONS

BACKGROUND AND SUMMARY OF THE INVENTION

The invention relates generally to integrated circuit fabrication processes and manufacturing methods and more particularly to copper metallization techniques used in the formation of conductive interconnections in integrated circuits.

The use of copper for interconnects in integrated circuits is an important field of research for integrated circuit manufacturers. As individual features on integrated circuits (ICs) become smaller, the size of metallized interconnects (lines, vias, etc.) also shrinks. The reduced size of interconnects can create unacceptable resistance in aluminum or tungsten conductors which increases impedance and propagation delays and can limit microprocessor clock speeds. Aluminum also is susceptible to electromigration which, in very fine (i.e., small cross-section) conductors, can cause discontinuities which produce device failure. Copper's greater conductivity, when compared with aluminum, tungsten, or other conductive materials used in ICs, is an important advantage. Copper also has greater resistance to electromigration. Both factors are important to manufacturers of ultra-large-scale-integration (ULSI) IC circuits, which is why copper is the subject of intensive research. The conductivity of copper is approximately twice that of aluminum and over three times that of tungsten. Copper thus is clearly advantageous for use in devices with ever-smaller geometries. With respect to electromigration, copper is approximately ten times better than aluminum, meaning that copper will better maintain electrical integrity.

A principle disadvantage of copper, presenting numerous processing problems for IC manufacturers, is its polluting effect on semiconductor materials. When copper comes in contact with semiconductor material it changes the semiconductor characteristics and destroys active circuit devices. A solution to this problem is to deposit a diffusion barrier material on the IC in regions where contact with copper metal must be avoided. The barrier material blocks the migration of copper into critical semiconductor regions while permitting electrical communication between the copper and the regions of the IC underlying the barrier material. TiN and TaN are examples of well-known and widely used diffusion barrier materials employed in IC copper metallization processes.

But diffusion barriers present another problem associated with copper metallization, copper adheres poorly to diffusion barrier materials. One prior art approach to adhering copper to diffusion barrier materials is to deposit the copper by means of physical vapor deposition (PVD), alternatively referred to as sputtering. PVD involves directing metallic copper onto a target surface. PVD improves adhesion between and the barrier material, but copper deposited by PVD exhibits poor conformality with surface features such as steps and high-aspect-ratio vias and trenches.

An alternative copper deposition process is chemical vapor deposition (CVD). In CVD, copper is combined with a ligand, or organic compound (the combination is called a copper precursor), and volatilized. The IC wafer or substrate, coated with diffusion barrier material, is heated and exposed to the precursor which decomposes when it strikes the copper-receiving surface. The heat drives off the organic material and leaves copper behind. Copper applied by conventional prior art CVD processes has greater conformality to surface features than copper deposited by PVD. But for most precursors, CVD adheres poorly to diffusion barrier materials.

Various techniques and been devised to improve the adhesion of CVD copper to barrier material. A typical approach is to apply CVD copper immediately after the deposition of the diffusion barrier material. It has generally been thought that the copper layer has the best chance of adhering to the diffusion barrier material when the diffusion barrier material surface is clean. Hence, the diffusion barrier surface is often kept in a vacuum, or controlled environment, and the copper is deposited on the diffusion barrier as quickly as possible. However, even when copper is immediately applied to the diffusion barrier surface, problems remain in keeping the copper properly adhered. A complete understanding of why copper does not always adhere directly to a diffusion barrier surface is lacking.

Despite the large amount of effort that has been expended on CVD, two major obstacles remain before a CVD copper process can be adopted in manufacturing. These two critical hurdles are (i) high cost of ownership (COO) for the CVD process and (ii) reliable adhesion to barriers. The presently available MOCVD processes and precursors do not satisfactorily fulfill both these criteria simultaneously without compromising film and process attributes. Since the precursor cost is a major contributor (>65%) to the overall COO of the CVD process, precursors that can be inexpensively manufactured are preferred. However, precursor costs have to be lowered without compromising film properties. For instance, reliable and repeatable adhesion has to be achieved while simultaneously maintaining low via and contact resistance low, high deposition rate, high conformality as well as low cost of the precursor. Many IC manufacturers have employed a PVD Cu seed layer followed by a CVD Cu fill in order to achieve adequate film properties. The use of a PVD Cu seed layer underscores the difficulty in achieving low contact resistance and reliable adhesion on barriers (TiN or TaN) by a CVD process alone.

As the size of features on ICs continues to shrink, it is desirable to continue developing improvements in the adhesion of CVD copper to barrier materials as a replacement for PVD, which is unsuitable for metallizing the smallest features.

It would be advantageous to provide a method of improving the adherence of copper metallization to diffusion barrier material without the sacrifice in conformality associated with PVD copper.

It would also be advantageous to provide a method of depositing copper on diffusion barrier material using chemical vapor deposition (CVD) to improve conformality, while also improving the adhesion between the copper and the barrier material.

In addition, it would be advantageous to discover a method adhering a thin seed layer of copper to surfaces of diffusion barrier material using high conformality CVD, wherein the thin seed layer serves as a receiving surface for the deposition of additional copper deposited by CVD using the most cost-effective precursors, with the second layer of CVD-deposited copper adhering strongly to the seed layer of copper through copper-to-copper bonds.

Accordingly, a method is provided for use in integrated circuit manufacturing for applying copper to copper-receiving surfaces of an integrated circuit substrate. The method comprises steps which include positioning the integrated circuit substrate in a chemical vapor deposition (CVD) chamber. In the CVD chamber, a first layer of copper is deposited on the copper receiving surfaces by means of chemical vapor deposition. The first layer of copper conforms and adheres to the copper-receiving surface and provides a copper layer to which subsequently-deposited copper will adhere. And then a second layer of copper is deposited by means of CVD on the first layer until a predetermined thickness of copper is formed on each copper receiving surface.

In the preferred embodiment of the present invention, the first layer of copper is deposited by means of CVD using (hfac)Cu(1,5-Dimethylcyclooctadiene) precursor, which has been found to exhibit good conformality and adhesion under a wide range of processing conditions.

The first adhering conforming layer of copper deposited, regardless of the precursor used, is deposited to a maximum thickness of 1000 angstroms, with a suggested thickness range generally in the range of 50 to 300 angstroms and a preferred thickness generally in the range of 100 angstroms to 200 angstroms.

In the preferred embodiment of the invention the second layer of CVD copper is deposited using a different precursor from that used in depositing the first adhering conforming layer of CVD copper. If the suggested precursor, (hfac)Cu (1,5-Dimethylcyclooctadiene), is used in the deposition of the first layer of copper, the method recommends using a precursor other than (hfac)Cu(1,5-Dimethylcyclooctadiene) for depositing the second layer. The step of depositing a second layer of copper is preferably carried out in the same CVD chamber in which the first layer of copper is deposited using, although use of the different CVD chambers to deposit the first and second copper layers is within the scope of the invention.

The copper-receiving surfaces of an integrated circuit on which copper is deposited in accordance with the present invention will generally be diffusion barrier material applied to the integrated circuit substrate. Accordingly, an embodiment of the present invention preferably includes the preliminary step of depositing diffusion barrier material on the integrated circuit to form the copper-receiving surfaces on which the above-described method is practiced. The step of depositing diffusion barrier material includes depositing material selected from the group consisting of TiN, TiON, TiSiN, Ta, TaSiN, TaN, TiW, TiWN, Mo, WN, and WSiN. Deposition of the diffusion barrier material can be performed by means of CVD or PVD. If CVD deposition of the diffusion barrier material is employed, the first, or the second, or both layers of CVD copper can be deposited using the same CVD chamber used in the deposition of the diffusion barrier material.

The method of the present invention is alternatively characterized as a method of applying a seed layer of copper on diffusion barrier material in integrated circuit manufacturing. The seed layer of copper is provided as a layer to which additional copper, subsequently deposited, will adhere. The method comprises positioning an integrated circuit which has diffusion barrier material deposited thereon in a chemical vapor deposition (CVD) chamber. A thin layer of copper is then deposited by means of CVD on the diffusion barrier material. The preferred precursor for the CVD of the thin layer of copper is (hfac)Cu(1,5-Dimethylcyclooctadiene). Once the seed layer of copper has been deposited, the integrated circuit substrate is ready to receive a much thicker "fill" or "bulk" (second) layer of copper which will preferably be deposited on the substrate by CVD using a precursor other than (hfac)Cu(1,5-Dimethylcyclooctadiene). The terms "fill" and "bulk" as used herein means the second layer of CVD copper is intended to fill the interiors of vias and trenches and cover other topographical features on the surface of the substrate, and also means the second layer represents the majority of the mass of copper deposited on the substrate. The method assures that all the CVD deposited copper will strongly adhere to the diffusion barrier material since the seed layer is deposited using a precursor selected to provide good adhesion to barrier material and the second layer will adhere to the seed layer due to the mechanical strength of the copper-to-copper bonding which occurs between the copper layers.

DETAILED DESCRIPTION OF THE PREFERRED EMBODIMENT

Figure 1:
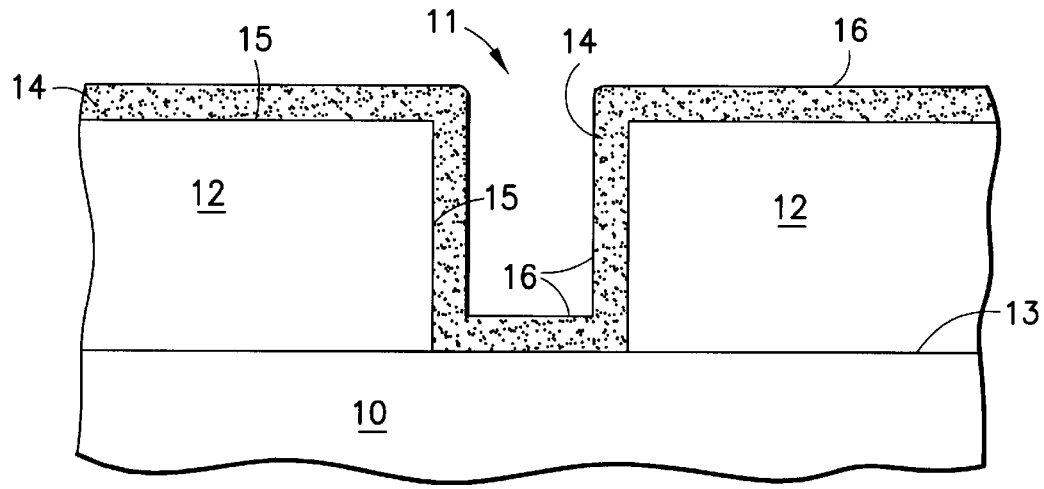
FIGS. 1–3 schematically show a sectional view of a portion of an integrated circuit substrate or wafer and illustrate steps in the method of applying CVD copper to a substrate using two copper deposition steps.

FIG. 1 is a schematic depiction of a small portion of a silicon or other suitable material semiconductor wafer 10 on which a plurality of integrated circuits are formed. In cross section, a single feature in the form of a trench or via 11 is formed in dielectric material 12 deposited on the surface 13 of the wafer 10. Via 11 illustrates the type of high-aspect-ratio feature which presents a challenge to deposit into during integrated circuit (IC) manufacturing. That is particularly true when copper is being deposited in the via 11 since it is first necessary to coat the interior walls and all other exposed surfaces with a continuous expanse of diffusion barrier material to prevent direct copper contact with the wafer substrate 10 and other features. FIG. 1 illustrates a deposited layer of diffusion barrier material 14 on surfaces 15 of the dielectric layer 12 and a portion of the surface 13 of substrate 10 within via 11. Other features (not shown) on substrate 10 will receive a similar surface deposit of diffusion barrier material and it will be understood by those skilled in the art of IC manufacturing that numerous features, and layers of features, may be present on substrate 10. The present invention is suitable for adherent CVD copper deposition on diffusion barrier material deposited on IC substrates during semiconductor device manufacturing and the figures presented herein illustrate the process and do not limit its application to any particular features or architecture.

The diffusion barrier material layer 14 is preferably deposited on the substrate by chemical vapor deposition (CVD), as will be described below, although other barrier material deposition processes may be used within the scope of the present invention, for example, physical vapor deposition (PVD) (i.e., sputtering). The thickness of diffusion barrier layer 14 is generally in the range of 25 Å to 800 Å, although the final selection of thickness is a matter of design choice and optimization. If it is deposited by CVD, the barrier layer 14 can be thinner since full coverage of features is substantially better. If deposited by PVD, the Barrier layer must be thicker to ensure continuous coverage within features such as via 11. Barrier material layer 14 prevents the migration of copper into semiconductor substrate 10. Two well-known diffusion barrier materials suitable for use with the present invention are titanium nitride (TiN) and tantalum nitride (TaN). The diffusion barrier material layer 14 is deposited in any selected region of the substrate where copper is to be deposited which, in the typical copper metallization processes used today, means all the surfaces of the wafer 10 including any structures formed thereon. All surfaces 16 of diffusion barrier layer 14, both within and outside via 11, are herein referred to as the copper-receiving surfaces of the integrated circuit substrate onto which adherent CVD copper is deposited in accordance with the present invention. Alternatively, the surfaces 16 of diffusion barrier layer 14 are referred to as copper-receiving surfaces on the integrated circuit substrate or copper-receiving surfaces on the diffusion barrier material deposited on the IC substrate.

Diffusion barrier materials are preferably electrically conductive to permit electrical communication between the copper layer deposited, as described below, on copper-receiving surfaces 16, and the regions of IC substrate 10 to which an electrical connection is desired. In addition to TiN and TaN mentioned above, other suitable diffusion barrier materials may be used with the method of the present invention. In its preferred embodiment, the diffusion barrier material is selected from the group consisting of TiN, TiON, TiSiN, Ta, TaSiN, TaN, TiW, TiWN, Mo, WN, and WSIN.

The selection of the diffusion barrier material for layer 14 is usually a matter of optimization. It depends on the processing steps which will be used before, during and after copper metallization. For example, TaN is generally recognized to be the most effective in prevent the diffusion of copper, although TiN is similar and provides better results if copper metallization is followed by chemical-mechanical polishing (CMP) to remove copper from selected regions of the IC substrate. For the purposes of discussing the present invention, it will be assumed herein that diffusion barrier layer 14 is TiN or TaN, although use of the alternative diffusion barrier materials is within the scope of the present invention.

Figure 2:
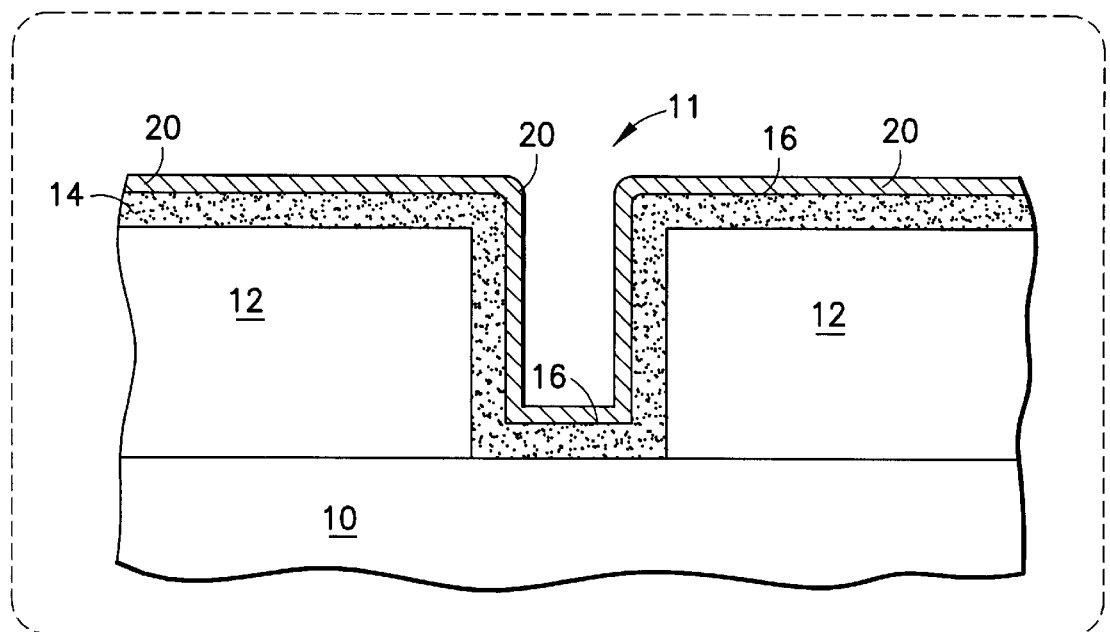
Figure 6:
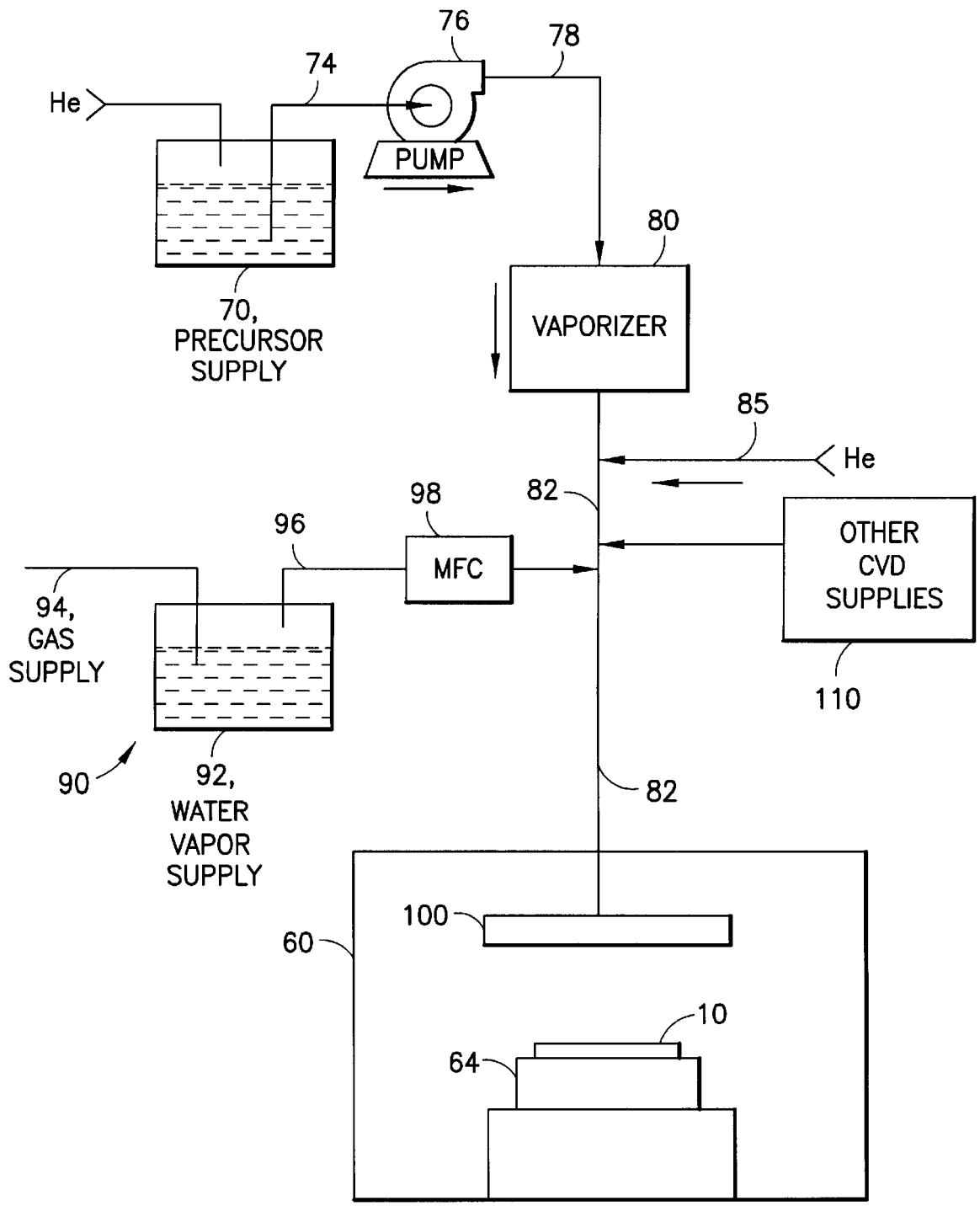
FIG. 6 is a partial schematic representation of a CVD chamber and associated apparatus for carrying outs certain steps in the method.

The first step in the preferred embodiment of the present invention is to position the substrate 10, as shown in FIG. 1 with barrier layer 14 thereon, in a chemical vapor deposition (CVD) chamber. CVD chamber 22 is schematically depicted in FIG. 2 by dashed lines. CVD chamber 22, which is more fully described with reference to FIG. 6, is a controlled-atmosphere reaction chamber into which a semiconductor wafer, such as integrated circuit substrate 10, is placed. Essentially, chemical vapor deposition involves introducing a metal CVD precursor, in the form of a metal-organic vapor, into a sealed chamber at an ambient pressure of 0.5 Torr-5 Torr (the preferred range is usually 2.0-Torr or less). A copper-containing precursor is introduced into the chamber. The integrated circuit substrate is heated to a temperature sufficient to cause thermal decomposition of the precursor. When the precursor strikes the copper-receiving surface of the substrate (barrier layer 14) the heated surface volatilizes the organic reactants and deposits high-purity metal on the substrate.

CVD processes are well known to those skilled in the art and have been the subject of extensive research related to copper metallization. See, for example, U.S. Pat. No. 4,842,891 entitled "Method of Forming a Copper Film by Chemical Vapor Deposition"; U.S. Pat. No. 5,744,192 entitled "Method of Using Water Vapor to Increase the Conductivity of Copper Deposited with Cu(hfac)TMVS"; T. H. Baum et al., "Chemical Vapor Deposition of Copper from Alkyne Stabilized Copper (I) Hexafluoroacetylacetonate Complexes," *Journal of the Electrochemical Society*, Vol. 140, No. 1, January 1993, pp. 154–159; and P. Doppelt et al., "Chemical Vapor Deposition of Copper for IC Metallization: Precursor Chemistry and Molecular Structure," *Materials Research Society Bulletin*, August 1994, pp. 41–48. Numerous precursors have been developed for use in copper CVD. All possess similar qualities in that most are relatively stable at room temperatures yet decompose into the deposited copper and reaction byproducts to leave high-purity copper on the receiving surfaces of the substrate at a consistent temperature, usually between 170° C. and 220° C. Many copper precursors have been developed and investigated. For example, several are identified and discussed in P. Doppelt et al., id., and a partial list of additional precursors is found in T. H. Baum et al., supra.

Referring to FIG. 2, after positioning integrated circuit substrate 10 in CVD chamber 22, the next step in the method of the present invention is to deposit a first adhering conforming layer of copper, by means of CVD, on each copper-receiving surface 16 of the substrate. The first adhering conforming layer of copper 20 is a thin layer of copper, not more than 1000 Å thick. It is recommended that first copper layer 20 have a thickness generally in the range of 50 Å to 300 Å and the preferred thickness is generally in the range of 100 Å to 200 Å.

Experimentation has revealed that an excellent copper precursor for depositing first adhering conforming layer 20 on copper receiving surfaces 16 is (hfac)Cu(1,5-Dimethylcyclooctadiene). The precursor (hfac)Cu(1,5-Dimethylcyclooctadiene) is available from Advanced Delivery and Chemical Systems, Ltd., of Danbury, CT under its trademark "CU15" and is alternatively known by the chemical identifier 1,1,1,5,5,5-Hexafluro-2,4-pentanedionato copper(1,5-dimethyl 1,5-cyclooctadiene). Still other alternative names for (hfac)Cu(1,5-Dimethylcyclooctadiene) are (hfac)Cu(DMCOD) or (hfac)Cu(Dimethyl COD) or (hfac) Cu(1,5-Dimethyl COD) or (hfac)Cu(1,5-DMCOD). This precursor has been found to produce excellent adherence to the surface of TiN and TaN diffusion barrier materials and exhibits excellent conformality and good resistivity, but it has not been widely used heretofore because of its low copper deposition rate which makes it uneconomic for bulk deposit of copper. Precursor (hfac)Cu(1,5-Dimethylcyclooctadiene) was the subject of early investigation, see P. Doppelt, id., but its low deposition rate renders it too costly for production applications using conventional methodologies. When used with the two-step copper metallization process of the present invention, however, (hfac)Cu(1,5-Dimethylcyclooctadiene) has been shown to be an ideal precursor for carrying out the step of depositing a first adhering conforming layer 20 of copper on the substrate 10. It is therefore the recommended precursor for use in carrying out the step of depositing a first adhering conforming layer of copper by means of CVD on each copper-receiving surface of the substrate. The precursor used in the step of depositing first adhering conforming layer of copper 20 is referred to herein as the first precursor.

Figure 3:
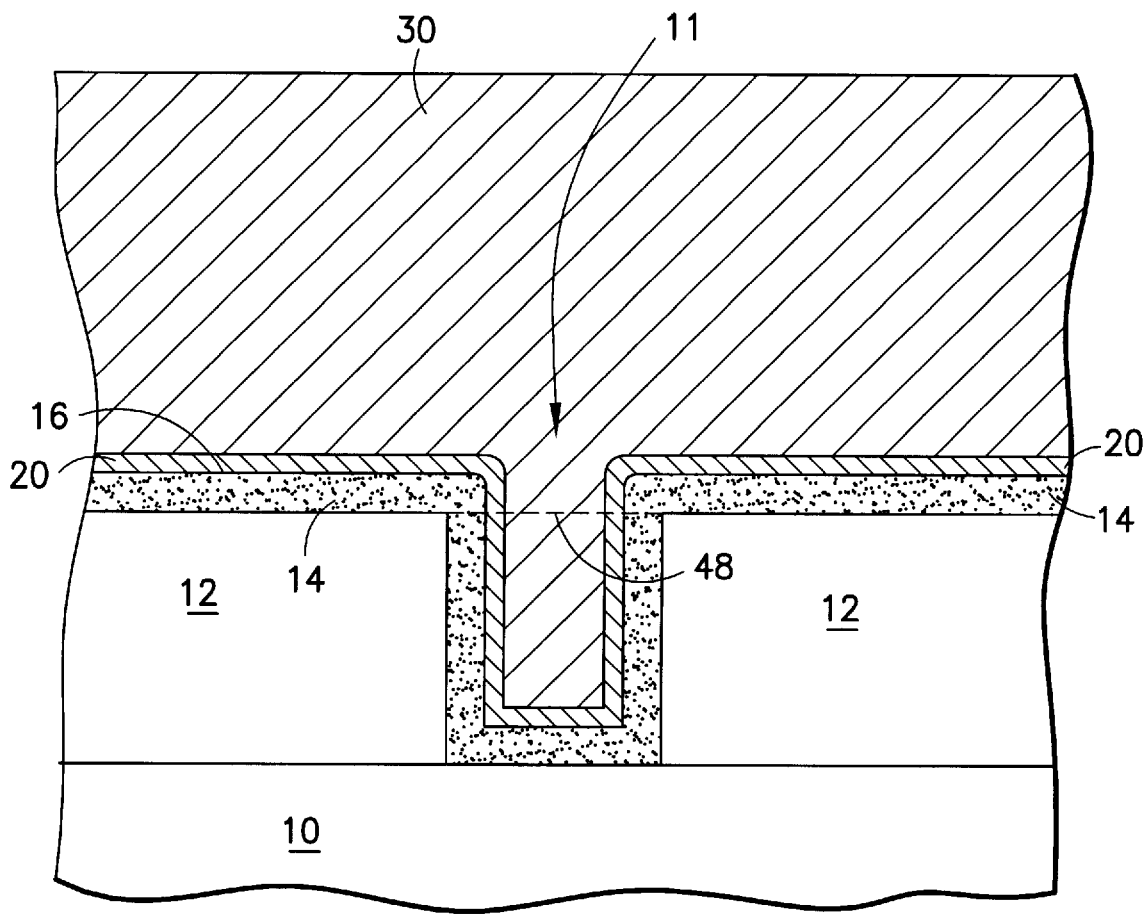

The next step in the method of the present invention is illustrated in FIG. 3. Following the deposit of first adhering conforming layer 20, a second layer of copper 30 is deposited onto the first layer until a predetermined thickness of copper has been laid down on each copper-receiving surface 16 of the substrate. The deposit of the second copper layer 30 is preferably also by CVD using a precursor other than the precursor used to deposit first adhering conforming copper layer 20. FIG. 3 omits the dashed-line representation of CVD chamber 22 shown in FIG. 2 but the completed product with two CVD copper layers 20, 30 deposited on substrate 10 is formed in one or more CVD chambers. The precursor selected for depositing second copper layer 30 might, for example, be a precursor having a higher deposition rate that might exhibit less conformality and adherence properties when applied directly to diffusion barrier material, but which provides good coverage when deposited directly on copper. It is a well known fact that copper bonds well to copper even when application techniques are used which produce poor adhesion to other materials. In fact, it is an important advantage of the present invention that the bulk of the copper to be deposited on an integrated circuit substrate is deposited on the first layer 20, which is a continuous integrated film of almost pure copper. Examples of CVD copper precursors suitable for use in depositing the second layer of copper 30 in accordance with the method of the present invention include Cu(hfac)VTMS; Cu(hfac)MHy; Cu(hfac)3-Hexyne; and Cu(hfac)2-Butyne. All those precursors have a higher deposition rate and are more economical to use than the recommended CVD copper precursor used in the deposition of first adhering conforming layer 20. All are readily available from commercial sources, for example, Advanced Delivery and Chemical Systems, LTD. Danbury, CT. A more complete listing of available precursors is found in P. Doppelt, id. and T. H. Baum, supra., as well as from IC chemical suppliers. Other suitable CVD copper precursors may be available, or may, in future, be developed, which are suitable for carrying out both the step of depositing a first adhering conforming layer of copper 20 and the step of depositing a second layer of copper 30 in accordance with the method of the present invention. The precursor used in the step of depositing second layer of copper 30 is referred to herein as the second precursor.

Figure 4:
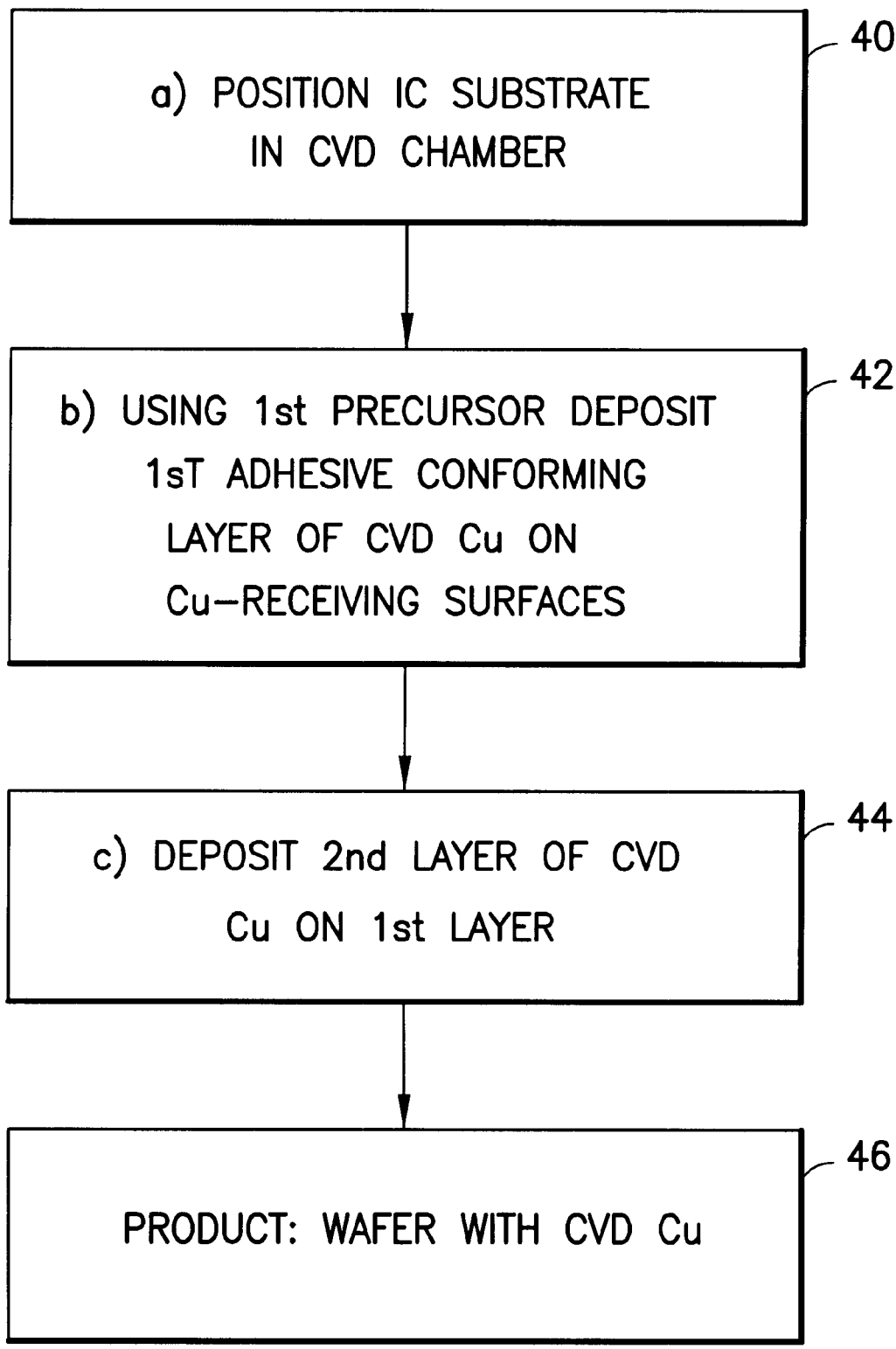
FIGS. 4 and 5 are flow charts showing steps selected embodiments of the method of the present invention.

FIG. 4 is a flowchart showing the steps in a first embodiment of the present which has already been described with reference to FIGS. 1–3. Preliminary step 40 provides that an integrated circuit substrate with copper-receiving surfaces thereon (surfaces 16 in FIG. 1), is placed in a CVD chamber. Typically, in CVD copper processing, the entire surface of a semiconductor wafer is coated with diffusion barrier material.

The next step 42 is the deposit of a first adhering conforming layer 20 (FIG. 2) of copper by means of CVD on each copper receiving surface of the substrate. The preferred copper precursor for carrying out CVD deposition in step 42 is (hfac)Cu(1,5-Dimethylcyclooctadiene). The first adhering conforming layer of CVD copper is preferably a thin layer, less than 1000 Å thick and recommended to be between 50 Å to 300 Å thick and more preferably between 100 Å and 200 Å thick.

The next step in the method is step 44, depositing a second layer of copper 30 (see FIG. 3) on first adhering conforming layer 20 to provide a predetermined thickness of copper on the copper receiving surface of the substrate. The second layer of copper deposited in step 44 is characterized as the "fill" layer and can alternatively be called the "gap fill" layer because it is intended to be a thick layer of copper, up to 1-micron or more in thickness. Layer 30 is intended to fill trenches and vias in the topography of the copper-receiving surfaces. Step 44 is the step where most of the mass of copper deposited on an integrated circuit substrate is laid down using less expensive CVD precursors which have a higher copper deposition rate.

Product 46 is the result of the method of the present invention. The product is an IC substrate on which layers of copper and barrier material have been deposited. Usually, substrate will then be subjected to numerous additional processing steps to finish the individual integrated circuit chips on a wafer. The product 46 can, for example, be subjected to chemical mechanical polishing (CMP) to remove portions of the deposited copper in preparation for laying down further interconnections and vias, or finishing the IC chip. The copper-coated wafer which is product 46 would, if subjected to CMP, have all the material deposited above dashed line 48 in FIG. 3 removed, leaving only the copper line or via within opening 11 on the substrate. Additional layer of dielectric, diffusion barrier material and copper could then be deposited, repeating the steps of the present invention, to complete a pattern of copper interconnects (not shown) in the manner well known to those skilled in the art of IC manufacturing.

Figure 5:
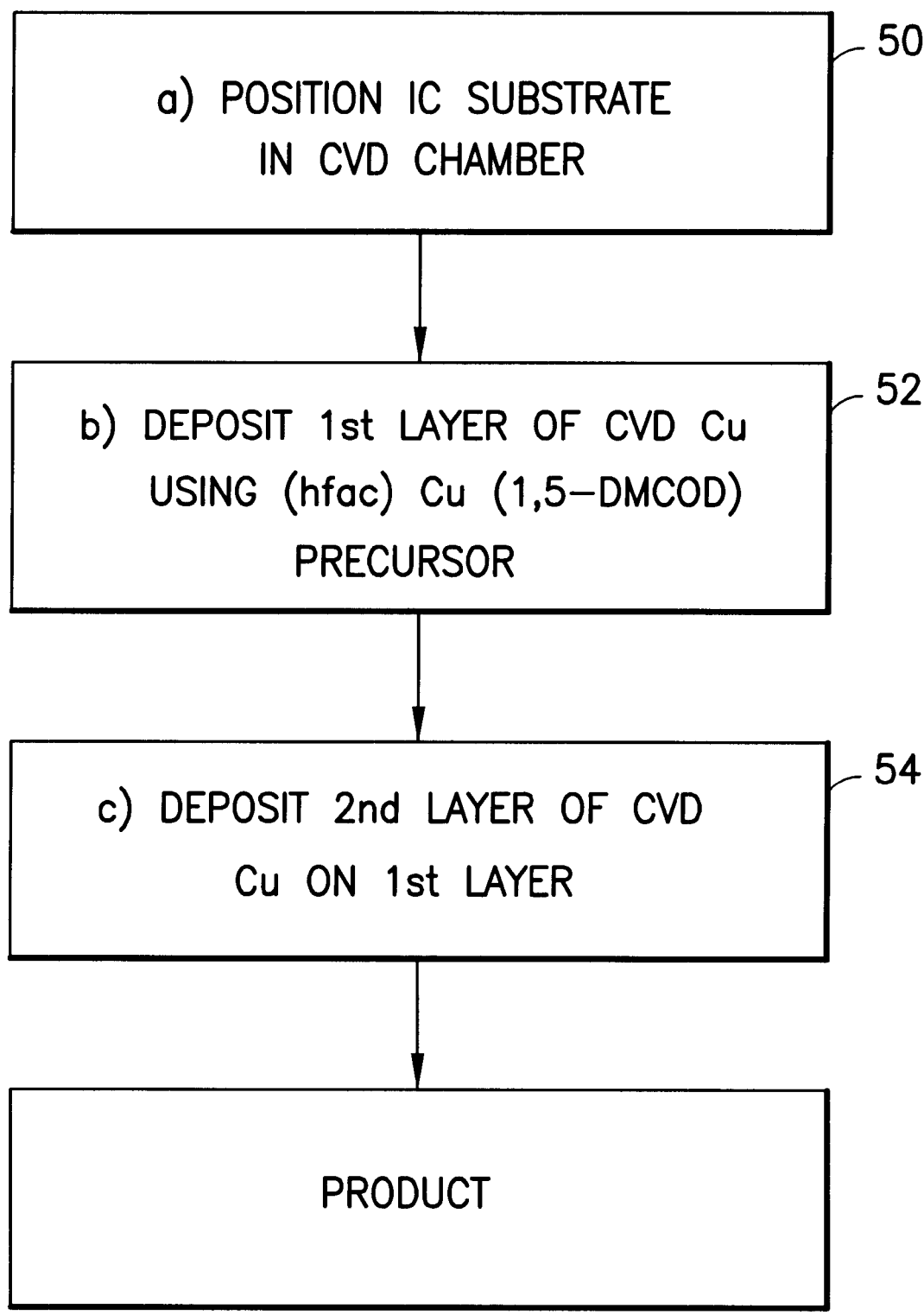

FIG. 5 illustrates a one embodiment of the invention specifying the preferred copper precursor used in depositing the first adhering conforming layer 20 of CVD copper. In the embodiment of FIG. 5, step 50 is the same as in FIG. 4. The next step 52 is the deposit of a first adhering conforming layer of copper on each copper receiving surface by means of CVD using (hfac)Cu(1,5-Dimethylcyclooctadiene) precursor. This yields first adhering conforming layer 20 as shown in FIGS. 2 and 3. The layer deposited in step 52 is preferably a thin layer as described with reference to step 42 in FIG. 4. The next step in the preferred embodiment of the method of FIG. 5 is step 54, which is the deposit of a "fill" layer by means of CVD using a precursor other than (hfac)Cu(1,5-Dimethylcyclooctadiene). The result of this method is the same as in FIG. 4 for product 46.

FIG. 6 is a schematic drawing of a suitable chemical vapor deposition (CVD) apparatus for carrying out the CVD steps in the method of the present invention. CVD chamber 60 is a sealed reaction chamber. Wafer/IC substrate 10 is positioned on a heated chuck 64. As shown in FIG. 6, wafer 10 has either been processed to include a diffusion barrier layer 14 on its surface, as shown and described above with reference to FIG. 1, or has not yet had layer 14 deposited, if the diffusion barrier is deposited using CVD. A discussion of the options for using the CVD apparatus of FIG. 6 is provided below but, for the purposes of the following description, it is assumed that the apparatus will be used to deposit first adhering conforming copper layer 20 (see FIGS. 1–3). Thus, the wafer 10 is positioned in CVD chamber 60 on a supporting chuck 64.

The interior ambient pressure in CVD chamber 60 is preferably generally in the range of 0.5-Torr to 2.0-Torr, although a broader range of pressures have been successfully used when depositing CVD copper. Further experimentation may show that CVD chamber pressures generally in the range of 0.1-Torr to 5.0-Torr may be useable with the present invention although, the first-named range is preferred.

Liquid precursor is supplied to CVD chamber 60 from a precursor supply reservoir 70, schematically shown as an enclosed tank. An inert gas such as helium (He) is used to displace the liquid precursor from supply reservoir 70. The precursor passes through a line 74 through a suitable pump 76 and via line 78 into vaporizer 80. The precursor is heated and vaporized and travels via line 82 to CVD chamber 60. Additional inert gas (He) is added to the vaporized precursor at 85.

Water vapor is preferably added to the vaporized precursor as it enters chamber 60 from a water vapor supply 90. The use of water vapor to improve the characteristics of CVD copper is described in detail in U.S. Pat. No. 5,744, 192, invented by Nguyen et al., the specification of which is incorporated herein by reference. As shown in FIG. 6, the water vapor supply 90 includes a bubbler tank 92 in which an inert gas, such as helium (He) or Argon (Ar), is supplied from gas supply 94 through the water in bubbler 92. Gas saturated with water is carried via line 96 to a mass flow controller (MFC) 98. The water saturated gas joins vaporized precursor line 82 before it enters CVD chamber 60. The vaporized precursor mixed with water vapor is distributed in chamber 60 through a suitable shower head 100. Other systems for adding water to copper precursors may alternatively be used with the method of the present invention.

The chuck 64 which supports wafer 10 in chamber 60 is heated to produce a temperature generally in the range of 170° C. to 250° C. at copper receiving surface 16 of diffusion barrier layer 14 on wafer 10 (see FIG. 1). As is well known to those skilled in the art of CVD copper, the vaporized precursor volatilizes when it strikes heated surface 16, depositing a layer of high purity copper metal on exposed surfaces. The deposition rate for the copper is dependent on the type of precursor used, the precursor flow rate, chamber temperature and pressure, and other factors. In the preferred embodiment of the method of the present invention wherein the first precursor used in step 52 (FIG. 5) is (fac)Cu(1,5-Dimethylcyclooctadiene), the flow rate of liquid precursor from precursor supply 70 into vaporizer 80 as generally in the range of 0.05 cc/min to 2.5 cc/min. That flow rate generally yields a deposition rate of copper on surface 16 in chamber 60 of 200–400 Å per minute. When carrying out the deposition of "fill" copper in step 54, a second precursor having a higher deposition rate will be used. For example, if the second copper layer is deposited using "Cupra Select" (trademark), marketed by Schumacher, of Carlsbad, Calif., alternatively know as Cu(hfac)VTMS, a typical copper deposition rate of 500 Å/min. to 4,000 Å/min will be achieved.

The apparatus schematically illustrated in FIG. 6 can be used conveniently to carry out both the copper deposition steps of the present invention, as well as the initial deposition of diffusion barrier material on the IC substrate to form the copper-receiving surfaces. This flexibility is illustrated schematically by box 110 in FIG. 6, "other CVD supplies." Box 110 represent one or more sources of CVD precursors different from the CVD copper precursor contained in supply 70. It can also be the source of barrier material deposited by CVD. As is well known to those skilled in the art, wafers can be processes by CVD through several stages if IC fabrication by carrying out several sequential steps in a single CVD chamber. For example, diffusion barrier material can first be supplied from source 110 to chamber 60 to deposit layer 14 on wafer 10. The first precursor can then be supplied to CVD chamber 60 from supply 70, depositing the first adhering conforming layer of copper on the surface 16 of layer 14. And a second precursor is then supplied (from generic source 110) to CVD chamber 60 for depositing the second "fill" layer of copper on the IC substrate. In that way, all steps described in detail herein can be carried out in a single CVD chamber 60.

Alternatively, the various CVD steps of the present invention can be carried out sequentially using different CVD chambers. Automated wafer handling tools are available which move wafers from one CVD chamber to the next. Either technique is suitable for carrying out the CVD steps of the present invention.

Figure 7:
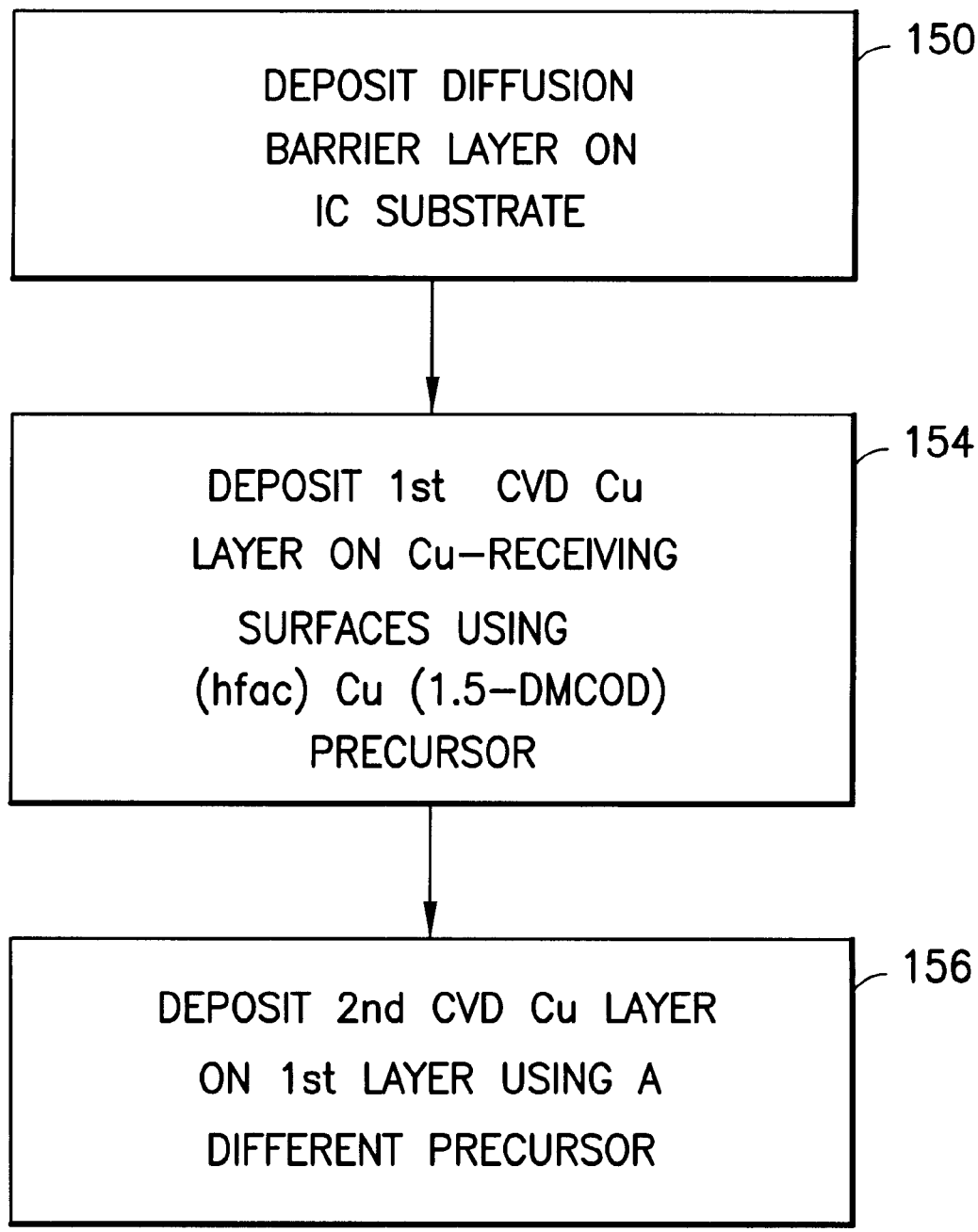
FIG. 7 is a flow chart illustrating steps in an alternative embodiment of the method of the present invention.

FIG. 7 illustrates an alternative embodiment of the method of the present invention which includes three steps. The first step 150 is the deposit by of diffusion barrier material on the integrated circuit substrate to form copper-receiving surfaces on the substrate. Step 150 is preferably carried out by CVD because it provides superior conformality and make use of the CVD processes employed in the two copper deposition steps. As noted above, the suggested diffusion barrier materials suitable for use with the present invention are selected from the group consisting of TiN, TiON, TiSiN, Ta, TaSiN, TaN, TiW, TiWN, Mo, WN, and WSiN. Although in this embodiment of the method it is suggested that the barrier material be deposited by CVD, other methods may be used for depositing the diffusion barrier material on the substrate. For example, diffusion barrier layer 14 may alternatively be deposited by PVD or sputtering.

The next step in the embodiment of FIG. 7 is depositing the first "seed" layer of copper by CVD using (hfac)Cu(1, 5-Dimethylcyclooctadiene) precursor. Step 154 preferably yields a thin seed layer between 20 Å and 1,000 Å thick and preferably generally in the range of 100–200 Å thick. As noted above, (hfac)Cu(1,5-Dimethylcyclooctadiene) yields an adherent conforming layer of high purity copper to which subsequently-applied CVD copper readily adheres and conforms. Then, in step 156, the second or "fill" layer of copper is deposited by CVD using a precursor other than (hfac)Cu (1,5-Dimethylcyclooctadiene). The selected precursor for use in step 156 will preferably be one which has a higher deposition rate than (hfac)Cu(1,5-Dimethylcyclooctadiene) since one of the purposes of the invention is to optimize production costs in IC manufacturing. Prior art methodologies, wherein CVD copper is deposited on ICs in a single step, would be uneconomic if (hfac)Cu(1,5-Dimethylcyclooctadiene) were used because of its slow deposition rate. The overall thickness of the second copper layer deposited in step 156, as well as in step 44 in FIG. 4 and step 54 in FIG. 5, is a matter of design choice and depends on size and shape of the topographical features on the IC substrate which are being filled or covered with copper.

The product of the embodiment of the present invention described with reference to FIG. 7 is the same as product 46 previously described with reference to FIG. 4.

What follows is an example of an IC wafer processed in accordance with the method of the present invention. Where appropriate, references to devices in FIG. 6 will be identified. The wafer processed in this example is positioned in a CVD chamber 60, having been previously coated with 400 Å of TiN.

EXAMPLE

A wafer 10, positioned on chuck 64 in chamber 60, is heated to a temperature of 195° C. CVD chamber 60 is kept at 0.5-Torr (interior) chamber pressure. The precursor (hfac) Cu(1,5-Dimethylcyclooctadiene) from supply 70 is injected into vaporizer 80 at a flow rate of 0.2 g/min. The flow of water bubbled inert gas (Ar) is turned on at a flow of 10 sccm. The vaporizer 60 is maintained at 60° C. The flow rate of the inert carrier gas (He) 85 is maintained at 100 sccm. After 60 seconds of precursor flow approximately 300 Å of an adhering, conformal seed layer has been deposited. At this stage, Cupraselect (trademark) precursor, (hfac)Cu (VTMS), is vaporized in a second vaporizer 110 and the flow of (hfac)Cu(1,5-Dimethylcyclooctadiene) and the water bubbled Ar gas is turned off. After another two minutes the Cupraselect flow is turned off and the wafer is removed from the chamber 60. The resulting wafer has a shiny, metallic copper film deposited on it that shows excellent adhesion and can be successfully etched via CMP.

The present invention overcomes several problems associated with copper CVD which have heretofore been the subject of intense study. Most particularly, the present invention solves the problem of reliable adhesion of CVD copper to diffusion barrier materials. Using a two-step CVD copper process, the invention deposits a first copper layer which is reliably adherent and conforming. It does so using a copper precursor which might otherwise be unsuitable for IC manufacturing because of its cost or low deposition rate. That precursor, preferably (hfac)Cu(1,5-Dimethylcyclooctadiene), is selected for depositing the first CVD copper layer because it is reliably and repeatably adherent to diffusion barriers. Because only a thin layer is deposited, the cost of the first precursor used in depositing the first copper layer, or its poor deposition rate, is relatively unimportant. Nevertheless, the discovery that (hfac)Cu(1,5-Dimethylcyclooctadiene) can be used to form a "seed" layer of CVD copper on diffusion barrier material represents an important advance in the art. The thin "seed" layer of deposited copper serves as an excellent foundation for the subsequent deposition of larger quantities of CVD copper using more conventional, higher yield, higher deposition rate precursors. Those precursors will readily adhere to the "seed" layer because of strong copper-to-copper bonding. The two-step CVD copper process of the present invention can be carried out sequentially in one CVD chamber, which can also be used to deposit the diffusion barrier material before copper deposition. Or the two-step CVD copper process can be carried out sequentially in different CVD chambers. The two-step CVD copper method ensures the lowest cost-of-ownership possible for copper metallization because the first precursor is optimized for adhesion and contact resistance, regardless of cost, deposition rate, or other characteristics and the second precursor is selected to optimize bulk fill considering such characteristics such as cost, deposition rate, resistivity, etc.

Alternative embodiments of the present invention will occur to those skilled in the art. For example, the preferred first precursor specified for depositing the first adherent conforming "seed" layer of CVD copper is identified as (hfac)Cu(1,5-Dimethylcyclooctadiene). Experimentation may well identify other precursors which are suitable for depositing the "seed" layer of CVD copper. Similarly, the "fill" layer of CVD copper may be deposited by whatever copper precursor proves to be optimal for the particular application. As noted above, copper precursors are the subject of ongoing study and research.

What is claimed is:

1. A method of applying copper to an integrated circuit (IC) substrate, the method comprising the following steps:
   depositing diffusion barrier material on the IC substrate to form copper-receiving surfaces;
   by means of chemical vapor deposition (CVD) of copper using (hfac)Cu(1,5-dimethylcyclooctadiene) precursor, depositing a first layer of copper on each copper-receiving surface to a selected thickness, whereby said first layer of copper adheres to the copper-receiving surface of the barrier material; and
   immediately depositing a second layer of copper on said first layer by means of CVD.

2. The method as in claim 1 in which said step of depositing diffusion barrier material includes depositing a diffusion barrier material selected from the group consisting of TiN, TiON, TiSiN, Ta, TaSiN, TaN, TiW, TiWN, Mo, WN, and WSiN.

3. The method as in claim 1 in which said step of depositing diffusion barrier material is performed by means of CVD.

4. The method as in claim 3 in which said step of depositing said first layer of copper is performed in the same CVD chamber as the step of depositing diffusion barrier material by means of CVD.

5. The method as in claim 1 in which the stop of depositing a first layer of copper includes depositing copper by CVD to a maximum thickness of 1000 Å.

6. The method as in claim 1 in which said step of depositing a first layer of copper includes depositing said first layer of copper to a thickness generally in the range of 50 Å to 300 Å.

7. The method as in claim 1 in which said step of depositing a first layer of copper includes depositing said first layer of copper to a thickness generally in the range of 100 Å to 200 Å.

8. The method as in claim 1 in which said step of depositing a second layer of copper is performed using a copper precursor different from (hfac)Cu(1,5-dimethylcyclooctadiene), whereby said first and second layers of copper are deposited by means of CVD using different precursors.

9. The method as in claim 8 in which said step of depositing a second layer of copper is performed in the same CVD chamber used in the step of depositing said first layer of copper.

10. The method as in claim 8 in which said step of depositing a first layer of copper and said step of depositing a second layer of copper are performed in different CVD chambers.

11. The method as in claim 1 in which said step of depositing diffusion barrier material is performed in a CVD chamber by means of CVD and said steps of depositing said first and second layers of copper are performed in the same CVD chamber used in the step of depositing said diffusion barrier material.

12. A method of applying a seed layer of copper on diffusion barrier material in integrated circuit manufacturing, the seed layer of copper providing a layer to which additional copper, subsequently deposited, will adhere, the method comprising:
   a) positioning an integrated circuit which has diffusion barrier material deposited thereon in a chemical vapor deposition (CVD) chamber, wherein surface areas of the diffusion barrier material will receive the deposit of copper; and
   b) by means of CVD vaporizing (hfac)Cu(1,5-dimethylcyclooctadiene) precursor, depositing a layer of copper on the diffusion barrier material, whereby the layer of copper adheres to the diffusion barrier material and serves as a seed layer to which a subsequently-applied copper layer is immediately applied to form two layers in a two step CVD deposition process.

13. The method as in claim 12 in which said layer of copper deposited on the diffusion barrier material in step b) has a thickness of 1000 Å or less.

14. The method as in claim 12 in which said layer of copper deposited on the diffusion barrier material in step b) has a thickness generally in the range of 50 Å to 300 Å.

15. The method as in claim 12 in which said layer of copper deposited on the diffusion barrier material in step b) has a thickness generally in the range of 100 Å to 200 Å.

16. The method as in claim 12 including a further step, following step b), of depositing a second layer of copper on said layer of copper, said second layer of copper being deposited by means of CVD using a copper precursor different from (hfac)Cu(1,5-dimethylcyclooctadiene), whereby said first and second layers of copper are deposited by means of CVD using different precursors.

* * * * *